United States Patent [19]

Austin et al.

[11] Patent Number: 4,950,997

[45] Date of Patent: Aug. 21, 1990

[54] DIAGNOSTIC TESTING DEVICE FOR SEED TUBE SENSORS

[75] Inventors: Glen A. Austin, 9906 Lincoln, Des Moines, Iowa 50322; Brad Goode, West Des Moines, Iowa

[73] Assignee: Glen A. Austin, Des Moines, Iowa

[21] Appl. No.: 386,437

[22] Filed: Jul. 28, 1989

[51] Int. Cl.⁵ .............................................. G01R 31/02
[52] U.S. Cl. .................................... 324/556; 324/133; 340/644
[58] Field of Search .................. 324/555, 556, 133; 340/684, 641, 642, 644

[56] References Cited

U.S. PATENT DOCUMENTS

| | | | |
|---|---|---|---|
| 3,537,091 | 10/1970 | Schenkenberg | 340/239 |
| 3,723,989 | 3/1973 | Fathauer et al. | 340/259 |
| 3,870,950 | 5/1975 | Lass | 324/556 |
| 3,962,630 | 6/1976 | Chaffee | 324/133 |
| 4,176,315 | 11/1979 | Sunnarborg | 324/133 |
| 4,185,224 | 1/1980 | Thompson | 340/684 |
| 4,238,790 | 12/1980 | Balogh et al. | 340/684 |
| 4,268,825 | 5/1981 | Kaplan | 340/684 |
| 4,307,390 | 12/1981 | Steffen et al. | 340/684 |
| 4,333,096 | 6/1982 | Jenkins et al. | 340/684 |
| 4,369,895 | 1/1983 | McCarty et al. | 221/3 |
| 4,432,675 | 2/1984 | Machnee | 406/30 |
| 4,646,941 | 3/1987 | Grosse-Scharmann et al. | 222/23 |
| 4,710,757 | 12/1987 | Haase | 340/684 |
| 4,816,746 | 3/1987 | Peak | 324/555 |

Primary Examiner—Reinhard J. Eisenzopf
Assistant Examiner—Maura K. Regan
Attorney, Agent, or Firm—Zarley McKee, Thomte, Voorhees & Sease

[57] ABSTRACT

A portable testing device for seed tube and combine sensors is provided for checking the operability of the sensor in situ at the time a problem arises in the agricultural implement. The testing device includes a housing in which is mounted a printed circuit board and a battery for providing an electrical current to the components on the circuit board. The circuit board includes an on/off switch and an LED. An electrical coupler allows the device to be quickly and easily attached to the coupler of the planter harness so as to check the operability of a seed tube sensor. In operation, the LED blinks on and off when the sensor is properly operating, and remains lit when the sensor is malfunctioning.

20 Claims, 2 Drawing Sheets

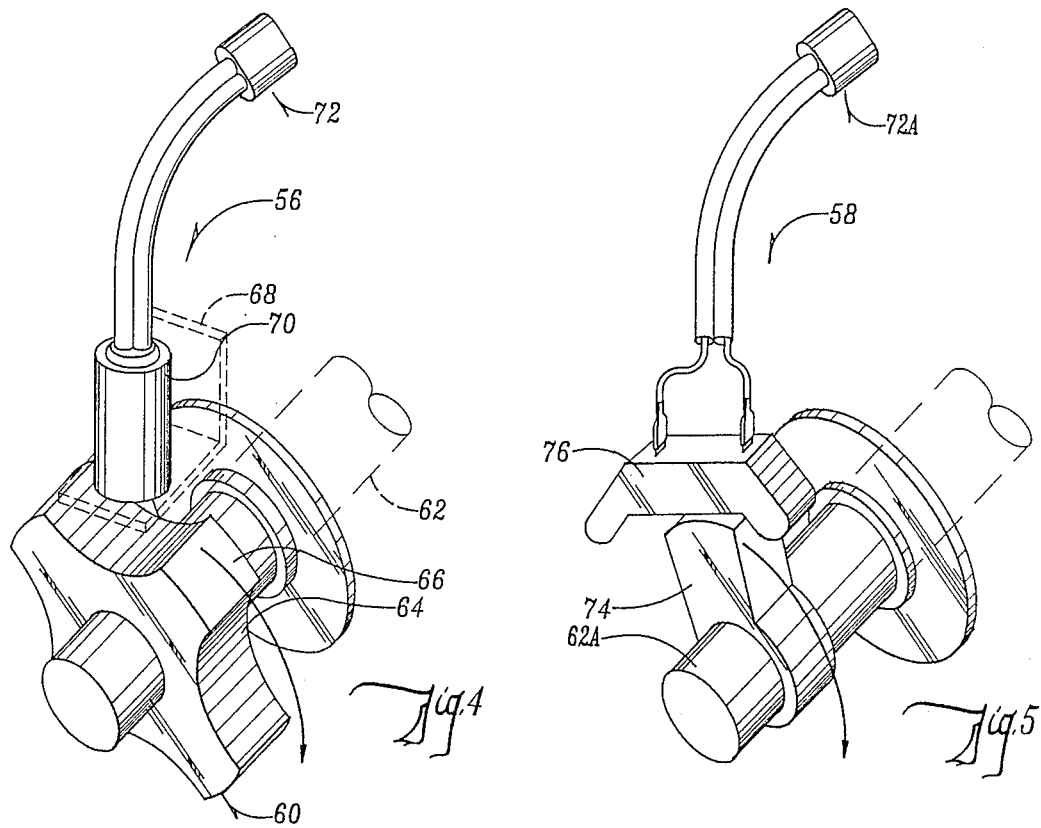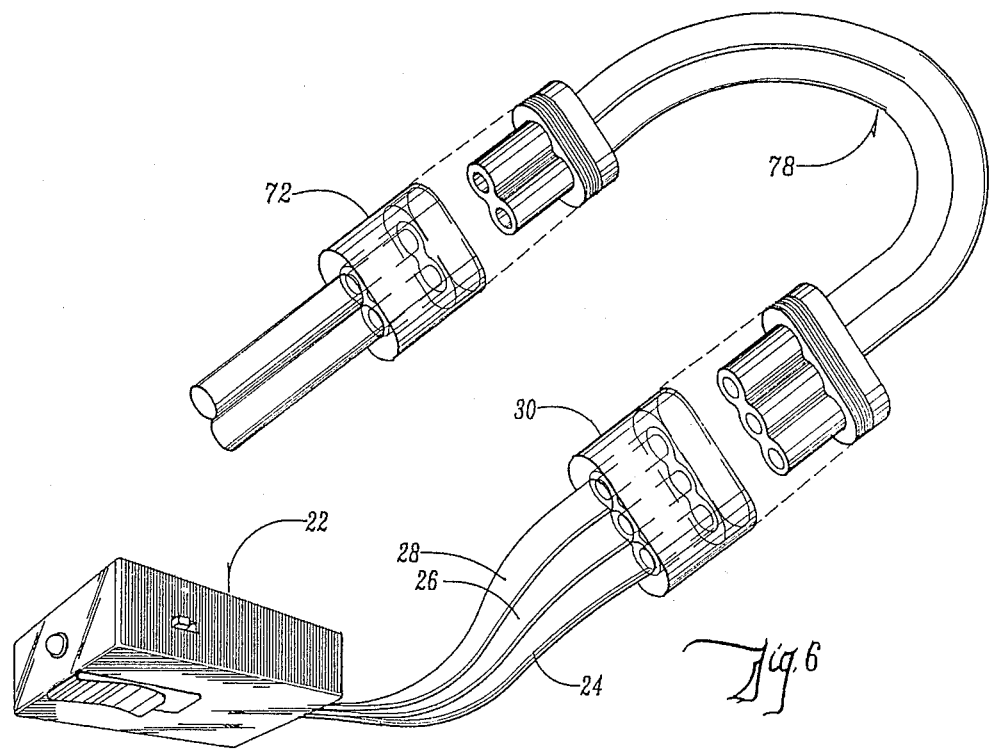

4,950,997

DIAGNOSTIC TESTING DEVICE FOR SEED TUBE SENSORS

BACKGROUND OF THE INVENTION

Agricultural planters often have a seed tube sensor which counts the seeds being planted. The sensor normally includes a photo-electric cell with a light emitter which generates a light beam, which in turn is sensed by a light receiver. The photo-electric cell for each seed tube is operatively connected to a monitor mounted in the tractor cab. The monitor has lights corresponding to the seed tube sensors. A monitor light for each seed tube sensor is normally on and will momentarily blink off each time the light beam from the photo-electric cell is broken by a seed passing through the seed tube.

When a monitor light remains off during planting, the operator cannot tell if the planter is properly planting seeds. For example, the seed tube may be blocked with chaff or the like such that seeds cannot pass therethrough. Another problem may be that dust has collected within the seed tube so as to prevent the sensor from functioning, but without effecting the passage of seeds through the seed tube. There may also be a problem elsewhere in the electrical system of the tractor, such as a corroded wire or a burned out monitor light. Thus, the problem may be anywhere between the discharge end of the seed tube and the tractor monitor. Such problems make it impossible for the operator to know whether seeds are being properly planted.

Since the photo-electric cell sensor is a key component of the planter system, it is desirable to know whether the photo-electric cell functioning properly when the monitor indicates that a problem exists. The seed tubes cannot be visually checked for blockage. Therefore, it is normally necessary to disassemble the planter and take the sensor and other components, or alternatively to take the entire planter, to a remote service station in order to check the operation of the photo-electric cells. Both of these alternatives are time consuming and therefore undesirable, particularly during the short planting season.

Agricultural combines also may have a sensor which monitors the combine speed. The sensor senses the rotation of a shaft on the combine and generates a signal in response thereto. The signal is transferred to a monitor in the combine or tractor cab which indicates the RPM of the shaft, and thus the combine's speed.

There are two basic types of combine sensors. The first type of sensor, commonly found on John Deere and Massey-Ferguson combines, includes a magnet mounted on the shaft with a spaced apart electronic pickup which generates an electrical impulse as the magnet passes by the pickup during each revolution of the shaft. The second type of sensor, often used on New Holland combines, includes a slotted disk or tooth gear mounted for rotation on the shaft, with a magnet spaced closely to the disk or gear so as to generate an impulse each time a slot or tooth passes by the magnet during the rotation of the shaft.

When the monitor indicates a malfunction, the operator cannot tell if the problem is in the combine, in the sensor, in the monitor, or in the electrical system of the tractor. Such problems make it impossible for the operator to know whether the combine is functioning properly.

Since the combine sensor is the easiest part to physically replace, it is common for a new sensor to be bought and installed. However, if the problem is not in the sensor, time and money have been wasted.

Accordingly, the primary objective of the present invention is the provision of a portable diagnostic device for testing seed tube and/or combine sensors in situ.

Another objective of the present invention is the provision of a portable testing device for checking the operation of seed tube or combine sensor which can be quickly and easily connected to the harness of the sensor.

A further objective of the present invention is the provision of a portable diagnostic device for agricultural implement sensors which is economical to manufacture and easy to use.

SUMMARY OF THE INVENTION

A hand-held diagnostic testing device is provided for checking a sensor on a seed tube planter or on a combine. The sensor is normally electrically coupled to a monitor in the tractor cab or combine cab. The device of the present invention is coupled to the sensor in place of the monitor.

The portable testing device includes a housing with an electrical components operatively mounted on a printed circuit board. The electrical circuitry includes a battery for supplying an electrical current and a light emitting diode (LED) capable of generating first and second signals. An electrical coupler is provided for connecting the electrical circuitry to the seed tube or combine sensor. When the testing device is coupled to the sensor, the battery provides an electrical current to the sensor, and such that the LED is lighted. The LED blinks off when the sensor is properly functioning and the LED continues to be lighted when the sensor is malfunctioning.

BRIEF DESCRIPTION OF THE DRAWINGS

FIG. 4 is a perspective view of one type of a combine sensor.

FIG. 5 is a partial perspective view of a second type of a combine sensor.

FIG. 6 is a perspective view of the testing device of the present invention, along with an adapter used for connecting the testing device to the harness of the combine sensor.

DETAILED DESCRIPTION OF THE DRAWINGS

Figure 1:
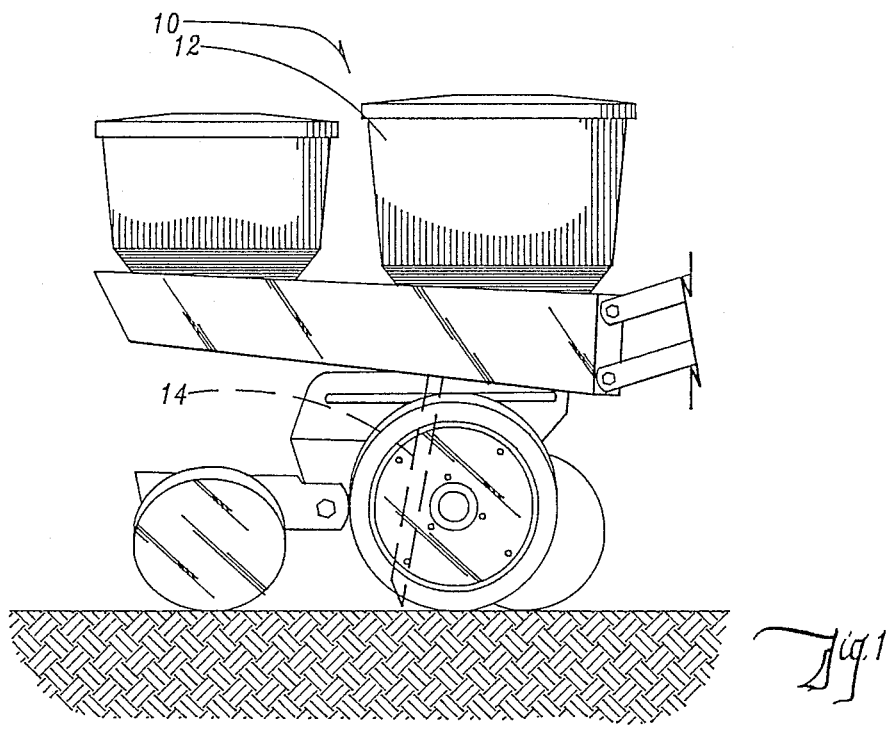
FIG. 1 is a side elevational view of a conventional agricultural planter, including a seed tube.

A conventional agricultural seed planter is generally designated by the reference numeral 10 in FIG. 1. Planter 10 includes a seed bin 12 and a seed tube 14, with a seed tube sensor 16 on the seed tube. The planter includes a plurality of such bins, seed tubes, and sensors.

Sensor 16 is a conventional photo-electric cell with a light emitter and a receiver. An electrical harness 18 with a coupler 20 is provided for electrically connecting the sensor to the electrical system (not shown) of the tractor which pulls the planter 10. The electrical system of the tractor also includes a monitor (not shown) in the tractor cab. The monitor has a plurality of lights, with one light being associated with each seed tube sensor 16. When the planter is planting seeds, the monitor lights are normally on and blink off each time a seed passes through the seed tube 14 so as to break the light beam of the photo-electric cell. When the monitor light remains off, a problem exists in the planter system and the operator cannot ascertain whether seeds are being properly planted.

The planter system described above is conventional and does not constitute a part of the present invention.

Since the photo-electric cell sensor 16 is a key component of the planter, it is reasonable to check the operation of the sensor as a first step when the monitor indicates that there is a problem in the planting operation. The diagnostic testing device generally designated by the reference numeral 22 in FIG. 2 allows a quick and easy in situ check of the sensor 16 without significant disassembly of the planter 10.

More particularly, device 22 includes a printed circuit board from which three wires 24, 26 and 28 extend. These wires terminate in a coupler 30 which allows quick and easy connection to the coupler 20 of sensor 16. The wires are color coded, with wire 24 being black for ground, wire 26 being green, and wire 28 being red for positive.

Figure 3:
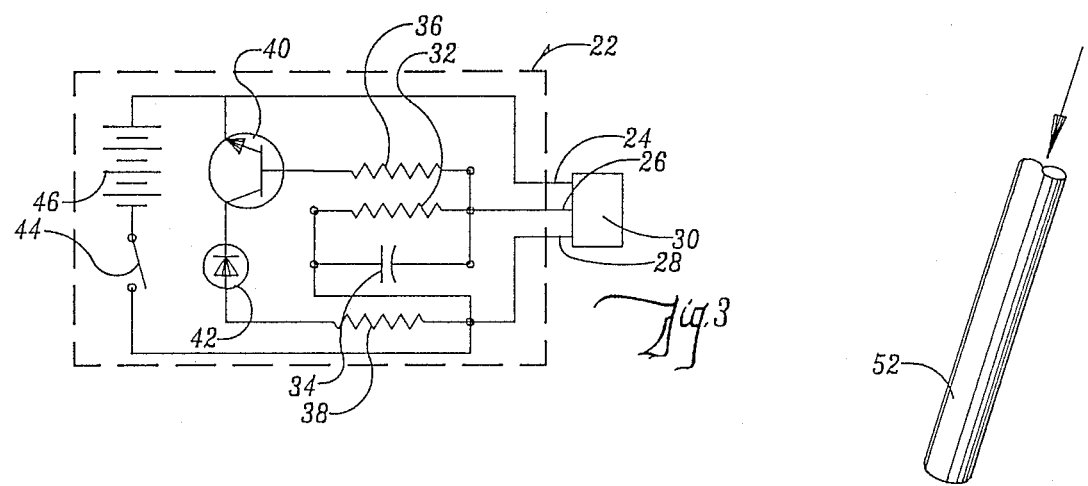
FIG. 3 is a schematic view of the electrical circuitry of the diagnostic device of the present invention.

The circuit board has several electrical components operatively connected thereto. More specifically, the circuit board includes a resistor 32 in parallel with a capacitor 34. Resistor 32 is also in parallel with a second resistor 36 and a third resistor 38. A transistor 40 and light emitting diode (LED) 42 are also electrically connected on the circuit board, as indicated in FIG. 3.

While the specifications for the electrical components can vary without departing from the scope of the present invention, the following specifications illustrate the preferred embodiment of the components in the electrical circuitry of device 22.

| ELEMENT | SPECIFICATION |
| --- | --- |
| Resistor 32 | 100 kilo-ohms ¼ Watt 5% |
| Capacitor 34 | 0.01 microfarad 50V 10% |
| Resistor 36 | 100 kilo-ohms ¼ Watt 5% |
| Resistor 38 | 820 ohms ¼ Watt 5% |
| Transistor 40 | 2N2222 |
| Diode 42 | |

The circuit board also includes a double pull, double throw on/off switch 44. A nine volt battery 46 is also operatively connected to the circuit board.

When switch 44 is moved to the on position, the battery 46 provides an electrical current through the electrical circuit. Resistor 32 pulls up the voltage, while capacitor 34 serves as a filter to eliminate spikes in the current. Resistor 36 functions as a current limit to transistor 40, while resistor 38 functions as a current limit to the LED 42. The transistor 40 acts as a switch to control the illumination of LED 42.

Figure 2:
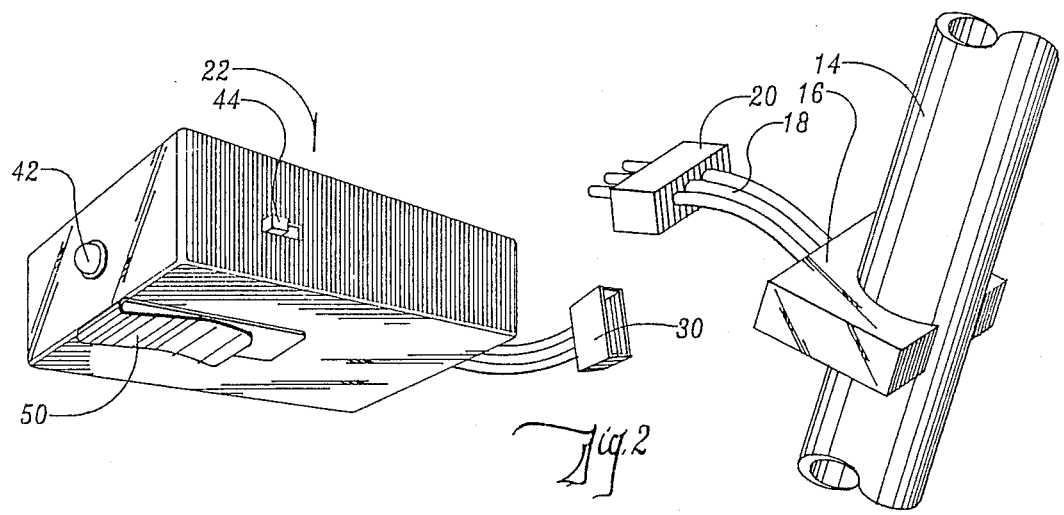
FIG. 2 is a perspective view showing both the hand-held diagnostic testing device of the present invention and an enlarged partial seed tube and the associated photo-electric cell.

The printed circuit board with all of its components 32-44 and battery 46 are mounted within a housing 48. Wires 24, 26 and 28 extend from the housing and switch 44 extends through an opening in the housing for easy control, as seen in FIG. 2. The LED 42 is mounted in the housing so as to partially extend therefrom for easy viewing so that the operator can easily see when the LED is lighted. Housing 42 may also have a clip 50 for holding device 22 on the operator's belt or on the sun visor in the tractor.

In operation, when a monitor light corresponding to one of the seed tube sensors 16 indicates improper functioning of the planter, the operator disconnects the planter harness so that coupler 20 can be quickly and easily attached to coupler 30 of the diagnostic testing device 22 of the present invention. After couplers 20 and 30 are joined, the operator moves switch 44 to the on position whereby the battery 46 provides an electrical current to the electrical components of device 22 so as to illuminate LED 42, and at the same time supply an electrical current to the photo-electric cell sensor 16. Resistor 32 allows a high voltage to be supplied to the transistor 40, so that the LED 42 lights up.

A light-blocking rod 52 or the like is then inserted into the seed tube 14 so as to pass between the light emitter and light receiver of the photo-electric cell 16. If the cell 16 is operating properly, upon the passing of rod 52 between the light emitter and light receiver, sensor 16 will generate a low voltage pulse which grounds resistor 32. The pulse therefore reduces the voltage to transistor 40 so that the transistor momentarily shuts off, and so that the light of LED 42 turns off. When sensor 16 is malfunctioning, no pulse is generated, so that LED 42 remains lighted even when rod 52 is inserted into tube 14. When LED 42 remains lit under these circumstances, this indicates that the cell 16 is not functioning properly and must be replaced.

Thus, when the tractor monitor indicates that there is a problem in the planting system, device 22 of the present invention can quickly and easily be connected to the sensor to ascertain whether there is a problem in the seed tube sensor 16. Such a sensor check can be done in the field or in the barn, without the need of disassembling the planter and taking parts to a service station for a remote test.

The testing device 22 can also be used to check the sensor on a combine. A conventional combine has a motor which drives multiple shafts upon which various components of the combine are mounted, such as the pickup auger and the concave. Normally, the combine also includes a sensor for monitoring the speed of the combine.

There are two basic types of combine sensors, both of which are based upon magnetic impulses generated in response to rotation of a shaft on the combine. FIG. 4 illustrates a first type of combine sensor 56 often found on New Holland combines. Sensor 56 includes a toothed gear or slotted disk 60 mounted on one of the combine shafts 62. Disk 60 includes slotted portions 64 and lobes 66. A support bracket 68 mounted on the combine adjacent shaft 62 supports a magnet 70 which is electrically connected to a monitor (not shown) in the combine or tractor cab by an electrical harness 72. In normal operation, during the rotation of shaft 62, each time a lobe 66 passes magnet 70, an electrical impulse is generated and sent to the combine monitor which converts the electrical impulses into a display of operational speed.

A second type of combine sensor 58, commonly found on John Deere and Massey-Ferguson combines, is shown in FIG. 5. This second type of sensor 58 includes a magnet 74 mounted on a combine shaft 62A for rotation therewith. An electronic pickup device 76 is mounted on the combine adjacent shaft 62A. Each time magnet 74 rotates past pickup 76, the pickup generates an electronic impulse. Pickup 76 is operatively connected to the combine monitor via harness 72A, and the monitor converts the electrical impulses into a display of the combine operational speed.

The combine sensors as shown in FIGS. 4 and 5 and as described above are conventional and do not constitute a part of the present invention.

When testing device 22 is used on a combine sensor, the sensor harness 72 or 72A is disconnected from the combine electrical system. An adapter 78 connects the three wire coupler 30 of device 22 to the two wire harness 72 or 72A of the combine sensor, so as to electrically couple electrical wires 26 and 28 of device 22. Wire 24 is a ground wire which is not utilized in the connection to the combine harness.

After coupler 30 is connected to harness 72 or 72A via adapter 78, switch 44 is moved to the on position such that battery 46 provides an electrical current to the electrical components of device 22, thereby illuminating LED 42, while supplying an electrical current to the magnet 70 or magnetic pickup 76. Resistor 32 allows a high voltage to be supplied to the transistor 40, so that the LED 42 lights up.

In the first type of combine sensor 56, shown in FIG. 4, if the sensor is properly operating during rotation of shaft 62, each time a lobe 66 passes magnet 70, an electrical impulse is generated which grounds resistor 32, thereby reducing the voltage to transistor 40 so that the transistor momentarily shuts off and so that the light of LED 42 turns off. If the sensor is malfunctioning, no impulse is generated as a lobe passes the magnet, and the LED 42 will remain lighted, thereby indicating a sensor malfunction.

Similarly, with the second type of combine sensor 58 shown in FIG. 5, each time magnet 74 passes pickup 76 as shaft 62A rotates, an electrical impulse is generated which reduces voltage to transistor 40 to momentarily shut off the transistor, thereby turning off the light of LED 42. If the sensor is malfunctioning, LED will remain lit since no impulse will be generated by the pickup in response to the passing of magnet 74.

Thus, when the combine monitor indicates that there is a problem in the combining operation, device 22 of the present invention can quickly and easily be connected to the combine sensor to ascertain whether the problem is in the sensor.

Therefore, it can be seen that the diagnostic testing device of the present invention accomplishes at least all of the stated objectives.

What is claimed is:

1. A hand-held diagnostic testing device for a seed sensor on a seed planter tube, the sensor including a photo-electric cell with a light emitter, a light receiver and an electrical coupler for selectively connecting the sensor to a monitor, the testing device comprising:
   a housing;
   electrical circuitry within the housing, including a power means for supplying an electrical current and signal means capable of generating first and second signals;
   an electrical coupler operatively connected to the electrical circuitry and adapted to be selectively connected to the coupler of the seed sensor, such that the power means provides an electrical current to the photo-electric cell, and such that the signal means generates the first signal; and
   whereby upon passing of a light-blocking means between the light emitter and light receiver, the signal means generates the second signal when the photo-electric cell is properly functioning and the signal means continues to generate the first signal when the photo-electric cell is malfunctioning.

2. The testing device of claim 1 further including a transistor which is normally on so as to complete the electrical circuit to the signal means, thereby generating the first signal and which shuts off in response to the impulse generated by the functioning sensor, so as to break the electrical circuit to the signal means, thereby generating the second signal.

3. The testing device of claim 2 wherein the electrical circuitry further includes a resistor for controlling the voltage to the transistor.

4. The testing device of claim 1 wherein the electrical circuitry further includes a printed circuit board.

5. The testing device of claim 1 wherein the signal means is a light emitting diode, the first signal is illumination of the diode and the second signal is lack of illumination of the diode.

6. The testing device of claim 5 wherein the electrical circuitry further includes a resistor for limiting the current to the diode.

7. The testing device of claim 1 wherein the electrical circuitry further includes a switch for turning the device on and off.

8. The testing device of claim 7 wherein the electrical circuitry further includes a resistor for limiting the current to the switch.

9. The testing device of claim 1 wherein the electrical circuitry includes a capacitor for eliminating spikes in the current voltage.

10. The testing device of claim 1 wherein the power means is a battery.

11. A hand-held diagnostic testing device for a sensor on a combine, the sensor including a magnetic means for generating an electrical signal in response to rotation of a shaft on the combine, and an electrical coupler for selectively connecting the sensor to a monitor, the testing device comprising:
    a housing;
    electrical circuitry within the housing, including power means for supplying an electrical current and signal means capable of generating first and second signals,
    an electrical coupler operatively connected to the electrical circuitry and adapted to be selectively connected to the coupler of the combine sensor, such that the power means provides an electrical current to the magnetic means, and such that the signal means generates the first signal; and
    whereby upon rotation of the combine shaft, the signal means generates the second signal when the magnetic means is properly functioning and the signal means continues to generate the first signal when the magnetic means is malfunctioning.

12. The testing device of claim 11 further including a transistor which is normally on so as to complete the electrical circuit to the signal means, thereby generating the first signal and which shuts off in response to the impulse generated by the functioning sensor, so as to break the electrical circuit to the signal means, thereby generating the second signal.

13. The testing device of claim 11 wherein the electrical circuitry further includes a resistor for controlling the voltage to the transistor.

14. The testing device of claim 11 wherein the signal means is a light emitting diode, the first signal is illumination of the diode and the second signal is lack of illumination of the diode.

15. The testing device of claim 11 wherein the power means is a battery.

16. A method of in situ testing, of a sensor, the sensor including a photoelectric cell with a light emitter and a light receiver for generating an, electrical impulse in response to the non-passage of light therebetween and an electrical coupler for selectively connecting the sensor to a harness of a monitor, the method comprising:
   disconnecting the coupler of the sensor from the harness of the monitor;
   connecting the coupler of the sensor to an electrical coupler of a hand-held testing device, the device having an electrical circuit including power means and signal means capable of generating first and second signals;
   actuating the power means so as to provide an electrical current to the sensor, and so that the signal means generates the first signal; and
   blocking the light between the light emitter and the light receiver whereupon the signal means generates the second signal in response to the electrical impulse if the sensor is properly functioning and whereupon the signal means continues to generate the first signal if the sensor is malfunctioning.

17. The method of claim 16 wherein the first signal is generated as a light and the second signal is generated as a lack of light on a light emitting diode.

18. The method of claim 17 wherein the impulse opens the circuit to the diode and thereby causing the diode light to shut off.

19. The method of claim 18 wherein the sensor is a magnetic pickup which generates the impulse when the sensor is properly functioning in response to rotation of a shaft having metallic means for sensing by the magnetic pickup.

20. A method of in situ testing of a sensor for a rotating shaft, the sensor including magnetic means for generating an electrical impulse in response to the rotation of the shaft, and an electrical coupler for selectively connecting the sensor to a harness of a monitor, the method comprising:
   disconnecting the coupler of the sensor from the harness of a monitor;
   connecting the coupler of the sensor to an electrical coupler of a hand-held testing device, the device having an electrical circuit including power means and signal means capable of generating first and second signals;
   actuating the power means so as to provide an electrical current to the sensor, so that the signal means generates the first signal; and
   rotating the shaft whereupon the signal means generates the second signal in response to the electrical impulse if the sensor is properly functioning and whereupon the signal means continues to generate the first signal if the sensor is malfunctioning.

* * * * *